United States Patent
Sasaki et al.

(10) Patent No.: US 7,295,412 B2
(45) Date of Patent: Nov. 13, 2007

(54) PROTECTION CIRCUIT FOR POWER MANAGEMENT SEMICONDUCTOR DEVICES AND POWER CONVERTER HAVING THE PROTECTION CIRCUIT

(75) Inventors: Masataka Sasaki, Hitachi (JP); Katsumi Ishikawa, Hitachinaka (JP); Ryuichi Saito, Hitachi (JP); Koichi Suda, Mito (JP); Katsuaki Takahashi, Hitachiota (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/773,283

(22) Filed: Feb. 9, 2004

(65) Prior Publication Data

US 2004/0252432 A1   Dec. 16, 2004

(30) Foreign Application Priority Data

Jun. 13, 2003   (JP) ............................. 2003-169715

(51) Int. Cl.
*H02H 3/20* (2006.01)
*H02H 3/08* (2006.01)
*H02H 9/02* (2006.01)

(52) U.S. Cl. .................... 361/91.1; 361/91.5; 361/93.9

(58) Field of Classification Search ............... 361/91.1, 361/93.1, 93.9
See application file for complete search history.

(56) References Cited

U.S. PATENT DOCUMENTS

| | | | |
|---|---|---|---|
| 4,721,869 A * | 1/1988 | Okado | 326/14 |
| 5,210,479 A * | 5/1993 | Kimura et al. | 318/727 |
| 5,650,906 A * | 7/1997 | Marquardt et al. | 361/88 |
| 6,180,966 B1 * | 1/2001 | Kohno et al. | 257/173 |
| 6,190,282 B1 * | 2/2001 | Deguchi et al. | 477/5 |
| 6,812,586 B2 * | 11/2004 | Wacknov et al. | 290/52 |
| 2004/0075103 A1 * | 4/2004 | Topp et al. | 257/130 |

FOREIGN PATENT DOCUMENTS

| | | |
|---|---|---|
| JP | 2-262826 | 10/1990 |
| JP | P2000-295838 A | 10/2000 |

OTHER PUBLICATIONS

P. Horowitz et al., The Art of Electronics, Cambridge University Press, 2nd ed., pp. 52-53.*

* cited by examiner

*Primary Examiner*—Michael Sherry
*Assistant Examiner*—Zeev Kitov
(74) *Attorney, Agent, or Firm*—McDermott Will & Emery LLP

(57) ABSTRACT

A collector voltage of a power management semiconductor device is detected by a first comparator, and when the detected collector voltage exceeds a first reference voltage, the first comparator outputs a first detection signal. Furthermore, a gate voltage of the power management semiconductor device is detected by a second comparator, and when the detected gate voltage exceeds a second reference voltage, the second comparator outputs a second detection signal. The second reference voltage is a minimum gate voltage for feeding a rated power to the power management semiconductor device or over, and less than a line power voltage of a drive circuit of the power management semiconductor device. When both the first detection signal and second detection signal are being outputted, the gate voltage is reduced by a gate voltage reduction means so as to protect the power management semiconductor device from overcurrent and overvoltage.

13 Claims, 5 Drawing Sheets

PROTECTION CIRCUIT FOR POWER MANAGEMENT SEMICONDUCTOR DEVICES AND POWER CONVERTER HAVING THE PROTECTION CIRCUIT

BACKGROUND OF THE INVENTION

The present invention relates to a protection circuit for power management semiconductor devices for use in a semiconductor integrated circuit and a power converter having the protection circuit.

As a power management semiconductor device for use in a power converter, a bipolar/MOS composite type semiconductor device (IGBT (Insulated Gate Bipolar Transistor)) has been widely used in recent years. The IGBT has a characteristic that while the amount of collector current to flow is determined by a gate voltage and a collector voltage, an increasing rate in the collector current associated with an increase in the collector voltage suddenly becomes larger as the gate voltage increases.

When there occurs an arm short circuit or a load short circuit in the power converter, a line power voltage of the power converter is applied to the IGBT which is in ON operation and an excessive short circuit current flows due to above mentioned IGBT characteristic.

As a result, if a thermal break occurs due to the overcurrent, or even if the overcurrent is cut off in high-speed, a peak voltage caused by a circuit inductance during the cutting off is so big that the peak voltage may exceed the collector emitter voltage limit of the IGBT.

Therefore, a method for detecting a short circuit of the IGBT and protecting the IGBT is described in a patent JP-A-2-262826 corresponding to U.S. Pat. No. 5,210,479. The technology described in the patent determines that an IGBT is short-circuited when a gate voltage and a collector voltage of the IGBT are their respective reference values or over.

Furthermore, in a patent JP-A-2000-295838, a softly cutoff means for suppressing the generation of a peak voltage caused by a circuit inductance during cutting off is described.

SUMMARY OF THE INVENTION

In above patent JP-A-2-262826, it is described that a reference voltage whereby to determine a short circuit in the gate voltage of an IGBT is a line power voltage in a drive circuit of the IGBT, as shown by FIG. 1 of the patent.

Therefore, if a line power voltage is set as a reference voltage whereby to determine a short circuit in the gate voltage of a device which has a low threshold voltage, or has a large current gain, such as a trench IGBT, when a short circuit is detected, the gate voltage is in a state where a line power voltage of a gate drive circuit, for example 15V, has been applied thereto.

In the state where the line power voltage of the gate drive circuit is applied, a short circuit current flows that is several tens times the device rated current.

It is an object of the present invention to implement a protection circuit for power management semiconductor devices that is capable to detect the occurrence of an overvoltage or an overcurrent due to a short circuit of a circuit load or the like at an early stage.

The present invention is configured as follows so as to achieve above objects.

(1) A collector voltage of a power management semiconductor device is detected by a first comparator, and when the detected collector voltage exceeds a first reference voltage, a first detection signal is outputted. Further, a gate voltage of the power management semiconductor device is detected by a second comparator, and when the detected gate voltage exceeds a second reference voltage, a second detection signal is outputted.

The second reference voltage is a minimum gate voltage for feeding a rated current to the power management semiconductor device or over, and is less than a line power voltage of a drive circuit of the power management semiconductor device.

When the first and second detection signals are being outputted, the gate voltage is reduced by a gate voltage reduction means in order to protect the power management semiconductor devices from overcurrent or overvoltage.

This secures that an occurrence of an overvoltage or an overcurrent caused by a short circuit or the like of a circuit load or the like is detected at an early stage, thus making it possible to protect the power management semiconductor devices.

(2) If above second comparator is structured such that the gate voltage is detected based on the voltage separated by separation resistance for separating the gate voltage of the power management semiconductor device, it becomes possible to adjust the second reference voltage value by adjusting the resistance value of the separation value.

(3) It is possible to suppress the occurrence of a peak voltage caused by a circuit inductance during cutting off a semiconductor device by cutting off the drive signal of the drive circuit and reducing the gate voltage such that it sequentially declines when an overcurrent or the like occurs.

(4) The first reference voltage of the first comparator is a collector voltage when the power management semiconductor device is electrically continuous, or over, and less than a line power voltage of the drive circuit.

(5) Accuracy of the first and second reference voltage values can be improved by forming the first comparator, second comparator, a logic means, and a gate reduction means in a semiconductor integrated circuit together with the drive circuit.

The protection circuit described in above (1) is used as a protection circuit for the power management semiconductor device for controlling a switching operation of the power semiconductor device that converts power to AC power.

It is possible to detect an occurrence of an overvoltage or an overcurrent caused by a short circuit in a power semiconductor device or the like at an early stage without fail.

Other objects, features and advantages of the invention will become apparent from the following description of the embodiments of the invention taken in conjunction with the accompanying drawings.

DESCRIPTION OF THE EMBODIMENTS

Embodiments of the present invention will be described below with reference to accompanying drawings. It should be noted that the power converter controls, for example, the power to be supplied to an electric motor, and includes a rectifier for converting AC power to DC power, an inverter for converting DC power to AC power, and a DC to DC converter, which is a combination of the rectifier and inverter, for converting an inputted DC power to a desired DC power.

In the following embodiments of the present invention, an inverter will be described as an exemplary power converter. The inverter converts a DC power outputted from a DC capacitor to an AC power for supply to an electric motor

A First Embodiment

Figure 1:
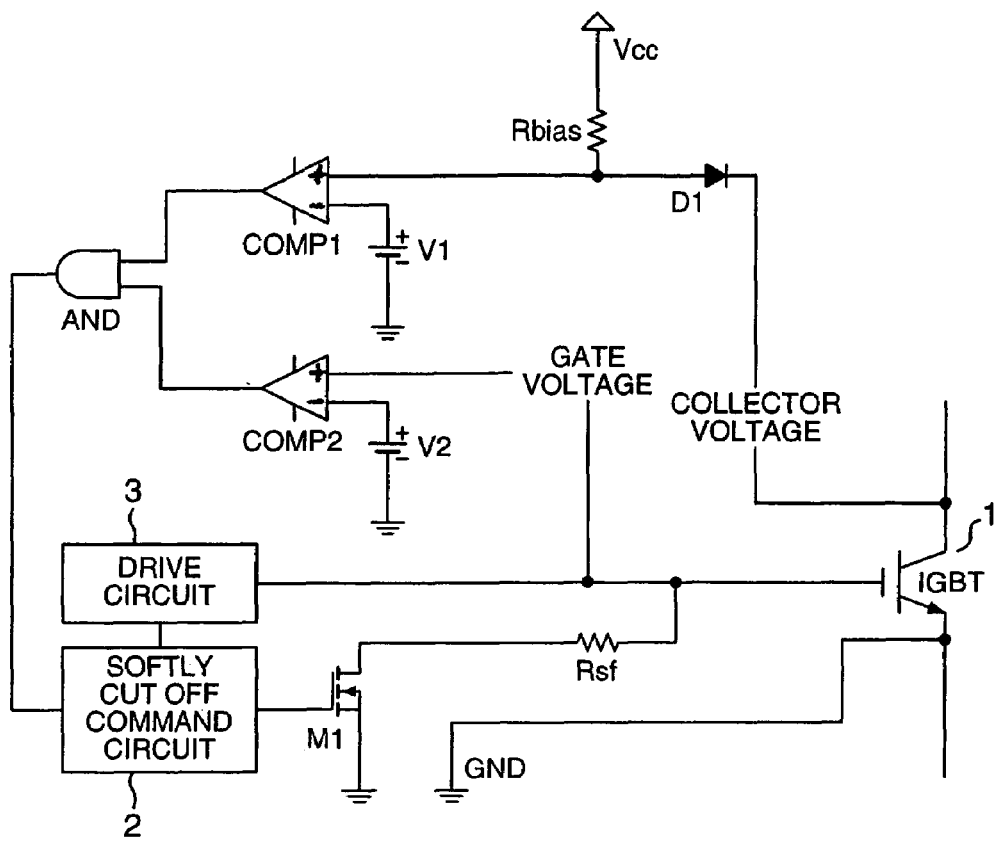
FIG. 1 is a diagram generally illustrating a protection circuit for power management semiconductor devices as a first embodiment according to the present invention.
Figure 2:
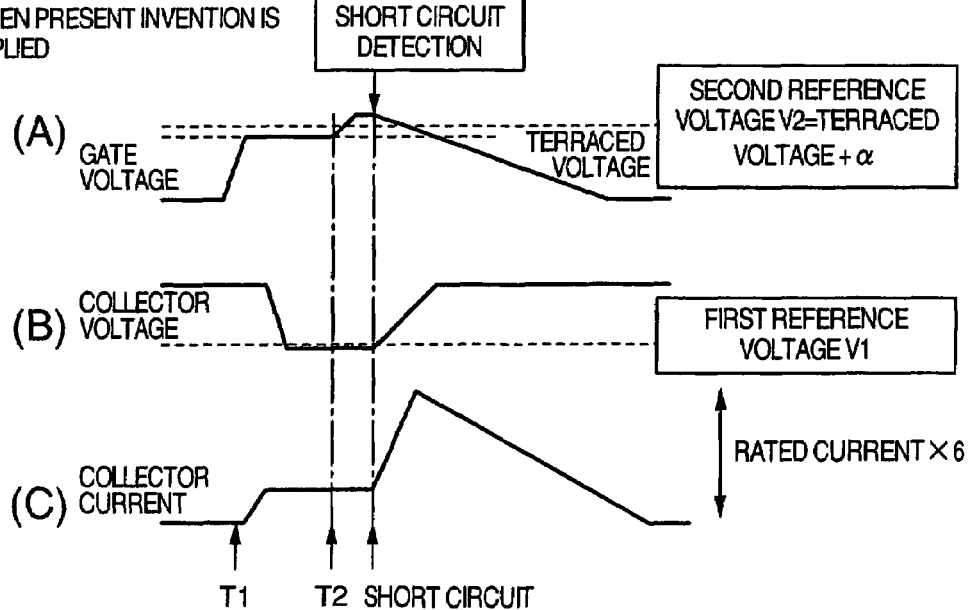
FIG. 2 is a diagram illustrating switching waveforms of an IGBT in the first embodiment according to the present invention.

FIG. 1 is a circuit diagram generally illustrating a protection circuit for power management semiconductor devices of a first embodiment according to the present invention and illustrates an example in which an IGBT is used as a semiconductor device to be protected. FIG. 2 is a diagram generally illustrating waveforms for each voltage and current during switching of the power semiconductor device, the IGBT.

In FIG. 1, an output signal of a drive circuit 3 is supplied to a gate terminal of the IGBT 1, and the IGBT 1 is switched following an ON/OFF command signal of the drive circuit 3.

A collector terminal of the IGBT 1 is connected to a noninverting input port of a first comparator COMP 1 via a diode D1. An anode terminal of the diode D1 and the noninverting input port of the first comparator COMP 1 are connected to a line power voltage Vcc via a resistance Rbias. The resistance Rbias is a bias resistance for setting a conduction current value of the diode D1.

Furthermore, a first reference voltage V1 is applied to a an inverting input port of the first comparator COMP 1 and the first comparator COMP 1 comprises a collector voltage detection circuit for comparing the first reference voltage V1 with a collector voltage (an anode terminal voltage of the diode D1), which is applied to the noninverting input port, to detect the collector voltage.

Furthermore, the gate terminal of the IGBT 1 is connected to a noninverting input port of a second comparator COMP 2, and a second reference voltage V2 is applied to an inverting input port of the second comparator COMP 2. The second comparator COMP 2 comprises a gate voltage detection circuit for comparing the gate terminal of the IGBT with the second reference voltage V2 to detect the gate voltage.

An output signal of the first comparator COMP 1 and that of the second comparator COMP 2 are inputted to a logic circuit AND. When their logical product becomes "1", the output signal from the logic circuit AND is assumed as a short circuit detection signal.

The short circuit detection signal from the logic circuit AND is supplied to a softly cutoff command circuit 2. An output signal from the softly cutoff command circuit 2 is connected to the drive circuit 3 and a transistor MI for the softly cutoff command circuit.

A softly cutoff resistance Rsf is connected between a drain terminal of the softly cutoff transistor M1 and the gate terminal of the IGBT 1. The softly cutoff transistor M1, resistance Rsf, and softly cutoff command circuit 2 form a voltage reduction means for reducing the gate voltage in slope down.

Next, an operation of the first embodiment according to the present invention will be described with reference to FIG. 2.

In FIG. 2, an ON command signal from the outside is first inputted to the drive circuit 3 at time T1, and a voltage is applied between the gate and emitter of the IGBT 1. As FIG. 2 (A) shows, the gate voltage is charged until it becomes a terraced voltage and ON-state, and as FIG. 2 (C) shows, a collector current flows. Further, as FIG. 2 (B) shows, the collector voltage of the IGBT 1 is maintained at an ON-state voltage (e.g. 2-3 V).

Here, the terraced voltage refers to a minimum gate voltage necessary to feed a certain collector current to the IGBT 1. It is influenced by a characteristic of the IGBT 1, and varies depending on the collector current. For example, it is approximately 7V in the case of a rated current level of a trench IGBT or the like, and is lower than a gate drive circuit line voltage (e.g. 15V), or about half of it.

When the collector voltage of the IGBT 1 is ON-state, the first comparator COMP 1 does not output a collector voltage detection signal, because the first reference voltage V1 for detecting the collector voltage is set at a voltage that is substantially higher than the ON-state collector voltage, and lower than the gate drive circuit line voltage (e.g. 15V), for example, 11V.

On the other hand, a second reference voltage V2 for detecting a gate voltage is set to be lower than the gate drive circuit line voltage, which is, for example, 15V, and to be a terraced voltage of the IGBT 1 or over(terraced voltage+α). During normal switching, when a collector voltage collection signal is being outputted, no gate voltage detection signal is set to be outputted from the second comparator COMP 2.

For example, the second reference voltage V2 is set to be 9V against 7V of the terraced voltage. This setting prevents the second comparator COMP 2 from outputting a gate voltage detection signal.

Afterwards, at time T2, the gate voltage of the IGBT rises from the terraced voltage to near the gate drive circuit line voltage, e.g. 14.5V.

In this case, since the gate voltage becomes higher than the second reference voltage V2 (9V), a detection signal of the gate voltage is outputted from the second comparator COMP 2.

At this time, if an overvoltage or an overcurrent occurs due to an arm short circuit or a load short circuit and thus the collector current and voltage of the IGBT 1 rise to be higher than the first reference voltage V1, a collector voltage detection signal is outputted from the first comparator COMP 1 and the logical product of the gate voltage detection signal and collector voltage detection signal becomes "1", thus a short circuit detection signal being outputted from the logic circuit AND.

The short circuit detection signal from the logic circuit AND is inputted to a softly cutoff command circuit 2, which issues a command to cut off the drive circuit 3, and activates the softly cutoff transistor M1.

Since the operation of the softly cutoff command circuit 2 reduces the gate voltage of the IGBT 1 more slowly and gradually than during ordinal switching, a surge of the collector voltage during cutting off is prevented, thus making it possible to secure the protection and cutting off of the IGBT 1.

In contrast, in the first embodiment according to the present invention, as described above, the second reference voltage value V2 for detecting a gate voltage is set to be a voltage value which is higher than the terraced voltage and substantially lower than the gate drive circuit line voltage. Therefore, it is possible to detect a short circuit in a load or the like and to enter into a protection operation of the IGBT 1 at the time when the collector voltage rises. This allows the protection of the IGBT 1 from damage due to a short circuit in the load or the like at an early stage without fail.

A Second Embodiment

Figure 3:
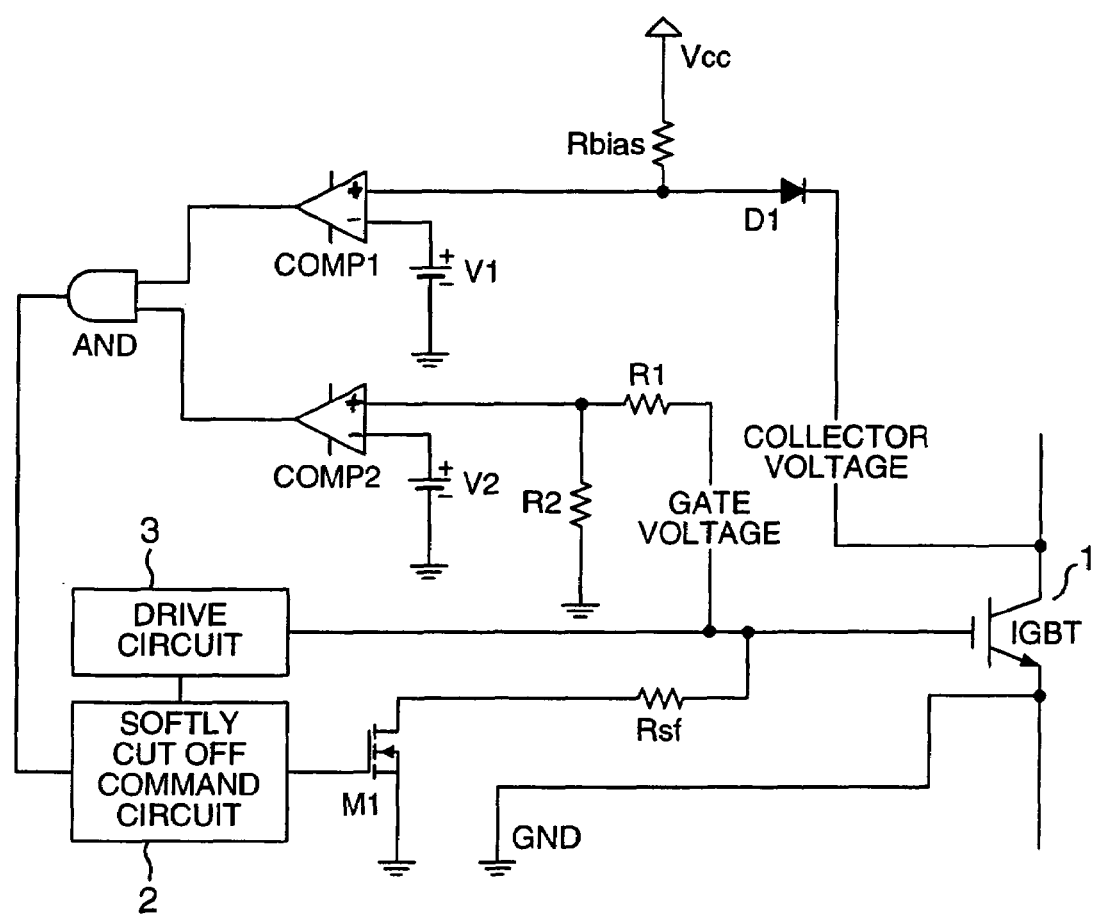
FIG. 3 is a diagram generally illustrating a protection circuit for power management semiconductor devices as a second embodiment according to the present invention.

Next, a second embodiment of the present invention will be described with reference to FIG. 3. FIG. 3 is a diagram generally illustrating a protection circuit of power management semiconductor device as the second embodiment according to the present invention, and an example in which an IGBT is used as a semiconductor device to be protected.

In the second embodiment, resistances R1 and R2 are connected between a gate of the IGBT and a noninverting input port of a second comparator COMP 2. The second embodiment is structured identically to the first embodiment except that these resistances R1, R2 are connected. Therefore, detailed description of the second embodiment is omitted.

One end of the resistance R1 is connected to the gate of the IGBT 1, the other end of the R1 being connected to a noninverting input port of the second comparator COMP 2. One end of the resistance R2 is connected to the other end of the resistance R1 and the noninverting input port of the second comparator COMP 2.

The gate voltage is configured such that it is divided by these resistances R1, R2 and the divided voltage is inputted to the noninverting input port of the second comparator COMP 2.

In addition to the fact that an effect is also provided in the second embodiment which is similar to that provided in the first embodiment, the second reference voltage V2 of the second comparator COMP 2 can be substantially changed by suitably setting the resistance values for R1, R2. Thus, it is possible to set a detection level of the gate voltage in accordance with a variety of characteristics of the terraced voltage of the IGBT.

Here, the first and second comparators COMP 1 and COMP 2, a logic circuit AND, a softly cutoff command circuit 2, a drive circuit 3, and a transistor M1 can be formed into IC circuits. In this case, even if the comparators or the like are formed into the IC circuits, a detection level of the gate voltage can be set in accordance with a variety of characteristics of the terraced voltage of the IGBT by suitably setting the resistance values of external resistances R1, R2.

A Third Embodiment

Figure 4:
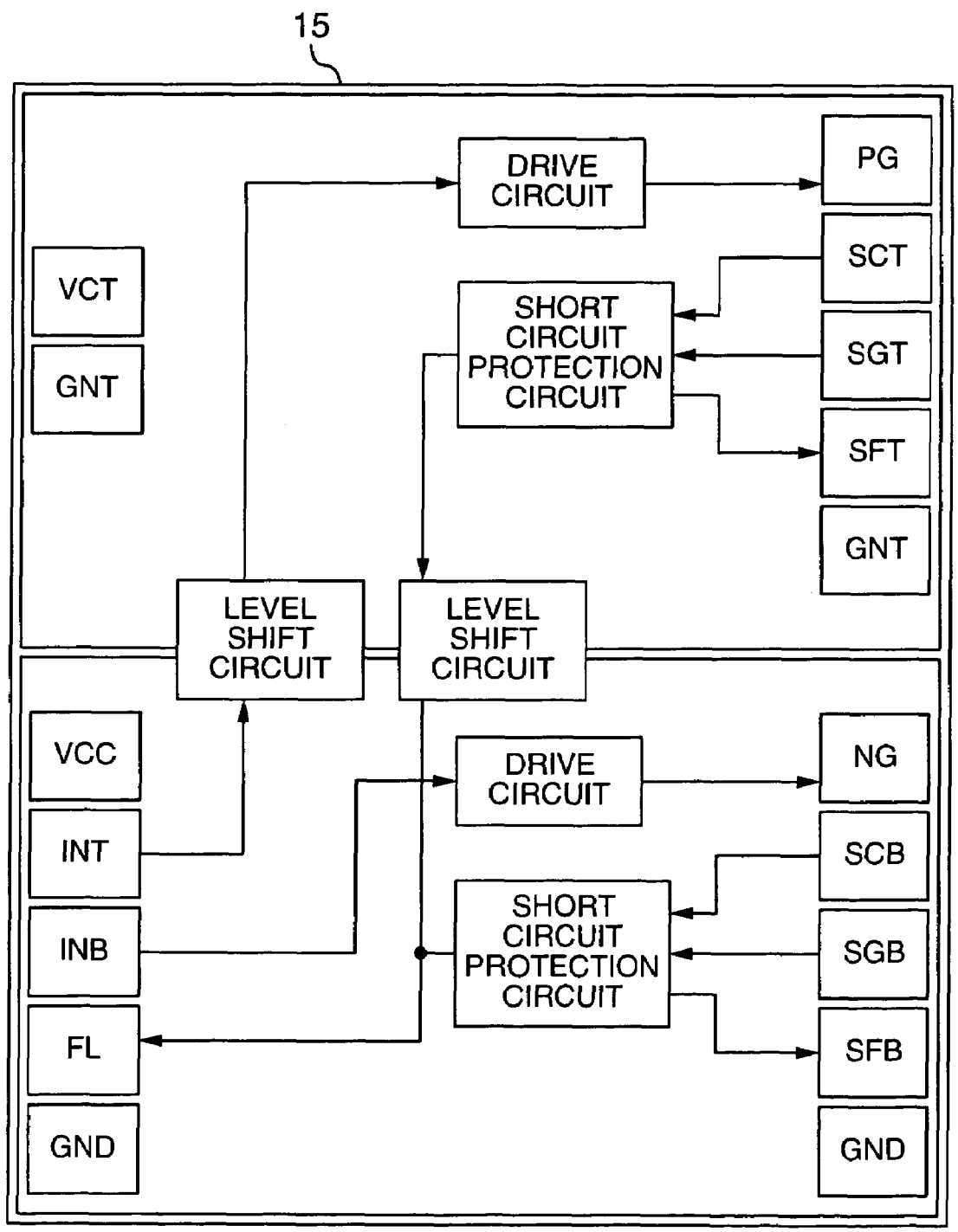
FIG. 4 is a diagram generally illustrating a semiconductor integrated circuit as a third embodiment according to the present invention.

FIG. 4 is a diagram generally illustrating a semiconductor integrated circuit mounted with a drive circuit including a protection circuit of a power management semiconductor device as a third embodiment according to the present invention.

A drive circuit comprising a pair of arms, upper and lower, for driving an IGBT is contained in one piece of semiconductor integrated circuit 15. The semiconductor integrated circuit 15 comprises line power terminals for each arm (VCT, VCC, GNT, GND), drive command input terminals (INT, INB), drive output terminals and protection detection operation terminals of the IGBT (SCT, SGT, PG, SFT, SCB, SGB, NG, SFB), and a protection detection output terminal (FL). Each of the upper and lower arms comprises a drive circuit and a short circuit protection circuit, and also comprises a level shift circuit for exchanging signals between the upper and lower arms.

The short circuit protection circuit of the semiconductor integrated circuit 15 comprises the first and second comparators COMP 1 and COMP 2, logic circuit AND, softly cutoff command circuit 2, and transistor M1 as shown in FIG. 1, wherein reference voltages V1, V2 of the first and second comparators COMP 1, COMP 2 are set to be the same values as those in the first embodiment.

According to the third embodiment, not only an effect is provided which is the same as that provided by the first embodiment, but also it is possible to improve precision of the reference voltages V1, V2 and to reduce variations in precision of detecting a short circuit in the IGBT by formation into semiconductor integrated circuits.

A Fourth Embodiment

Figure 5:
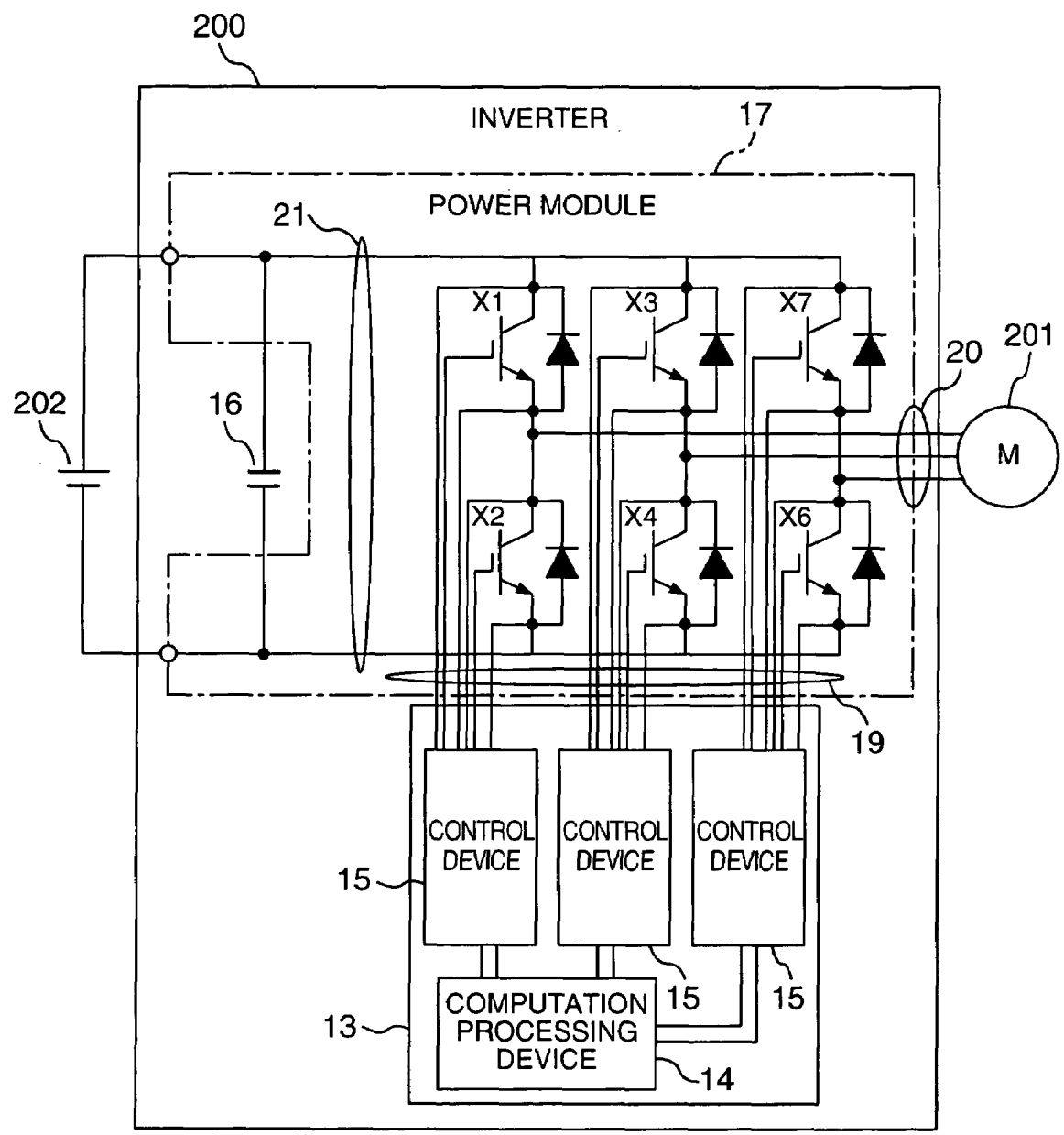
FIG. 5 is a diagram generally illustrating an inverter as a fourth embodiment according to the present invention.

FIG. 5 is a circuit diagram generally illustrating an inverter as a fourth embodiment according to the present invention. In FIG. 5, an inverter 200 comprises power semiconductor devices X1-X4, X6, X7 which are contained in a power module 17, and a control unit 13 for controlling the switching operation of the power semiconductor devices.

DC power supplied from a DC storage battery 202 (hereinafter, battery) is supplied to an inverter 200 through a wiring 21. The DC power supplied by the inverter 200 is temporarily accumulated in a capacitor 16 which is connected to the wiring 21 of the power module 17. The inverter 200 is supplied with DC power from a battery 202 to convert the DC power to AC power and to drive the electric motor 201.

The DC power from the battery 202 is converted to AC power by a power converter unit having power semiconductor devices X1-X4, X6, and X7 and then supplied to an electric motor 201 via a connection terminal 20 of the electric motor. Thus, the electric motor 201 is driven.

A control unit 13 comprises a control device unit 15 for controlling the switching operation of the power semiconductor devices X1-X4, X6, and X7, and a computation processing device 14 for instructing the control device unit 15 to perform a control operation (ON/OFF operation), and is connected to the power semiconductor devices X1-X4, X6, and X7 via a control terminal 19.

The control device units 15 of the control unit 13 correspond to the semiconductor integrated circuits in the third embodiment according to the present invention as described above.

In the fourth embodiment, a plurality of control device units 15 are mounted that correspond to the semiconductor integrated circuits in the third embodiment. Therefore, it is possible to detect a short circuit in the power semiconductor device, and to perform a protection operation at an early stage without fail, when there occurs a short circuit in the inverter 200 as a power converter, thus making it possible to improve the safety of the power converter.

A Fifth Embodiment

Figure 6:
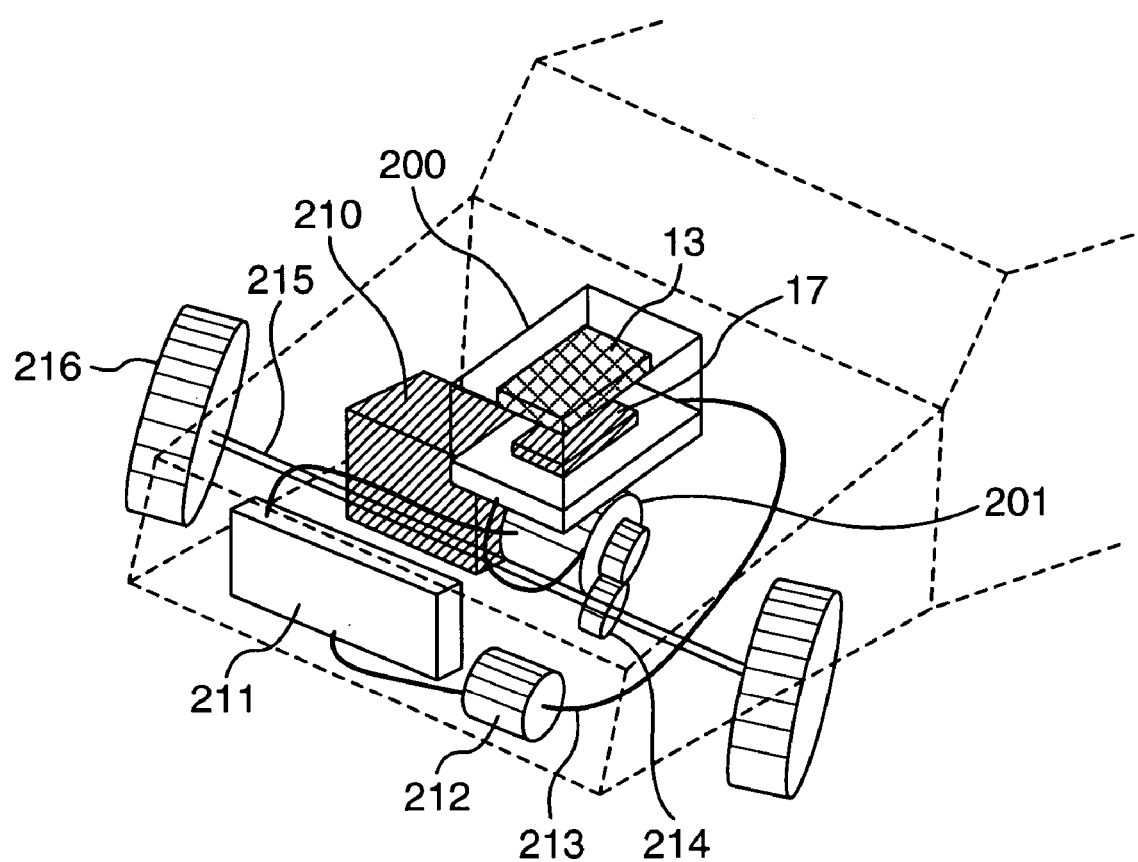
FIG. 6 is a diagram generally illustrating an engine room section of a hybrid electric vehicle as a fifth embodiment according to the present invention.

FIG. 6 shows a fifth embodiment according to the present invention and a diagram generally illustrating an engine compartment section of a hybrid electric vehicle equipped with the power converter (inverter) 200 of the fourth embodiment.

In FIG. 6, the inverter 200, an engine 210 as an internal combustion engine, an electric motor 201, a radiator 211, a pump 212 for cooling water, a piping 213, a transmission 214, and an axle 215 are disposed in the engine room.

Both ends of the axle 215 project outside the engine room and have wheel 216 attached therewith. The axle can be rotated by both the engine 210 and electric motor 201 via the transmission.

The inverter 200 for driving the electric motor 201 is disposed in the vicinity of the engine 210 and electric motor 201.

The inverter 200 comprises a control unit 13 which is formed of a printed circuit board which is contained in a case 10, and a power module 17.

It should be noted that in an electric vehicle structure, the axle 215 is driven only by power of the electric motor 201 without the engine 210 described in FIG. 6

The application of the inverter 200 according to the present invention to the hybrid electric vehicle or electric vehicle allows the protection of the power management semiconductor devices at an early stage without fail when a short circuit occurs in a power converter during driving. Thus, it becomes possible to improve the safety of the hybrid electric vehicle or electric vehicle.

The application of the power converter according to the present invention to the electric vehicle or hybrid electric vehicle allows the detection of a short circuit in the power management semiconductor devices and protection operation at an early stage without fail, thus making it possible to improve the safety of the electric vehicle or the like.

It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. A protection circuit for a power semiconductor device having a collector, a gate, and an emitter, the circuit comprising:
   a first comparator which detects a collector voltage of said power semiconductor device to output a first detection signal when the detected collector voltage exceeds a first reference voltage;
   a second comparator which detects a gate voltage of said power semiconductor device to output a second detection signal, when the detected gate signal exceeds a second reference voltage which is set, relative to the potential at the emitter of said power semiconductor device, to be lower than a line power voltage of a drive circuit for outputting a drive signal that drives said power semiconductor device and higher than a terraced voltage of the power semiconductor device;
   logic means for outputting a protection start signal when both the first and second detection signals are being output; and
   gate voltage reduction means for reducing said gate voltage in accordance with the protection start signal from said logic means, said power semiconductor device being a trench type power semiconductor device.

2. The protection circuit according to claim 1, wherein said second comparator detects said gate voltage based on a voltage obtained by dividing a gate voltage of said power semiconductor device by voltage dividing resistors.

3. The protection circuit according to claim 1, wherein said gate voltage reduction means cuts off a drive signal of said drive circuit and reduces said gate voltage such that it sequentially decreases.

4. The protection circuit according to claim 2, wherein said gate voltage reduction means cuts off a drive signal of said drive circuit and reduces said gate voltage such that it sequentially decreases.

5. The protection circuit according to claim 1, wherein the first reference voltage of said comparator is set at a voltage which is higher than an On-state collector voltage and lower than a line power voltage of said drive circuit.

6. The protection circuit according to claim 2, wherein the first reference voltage of said comparator is set at a voltage which is higher than an On-state collector voltage and lower than a line power voltage of said drive circuit.

7. The protection circuit according to claim 3, wherein the first reference voltage of said comparator is set at a voltage which is higher than an On-state collector voltage and lower than a line power voltage of said drive circuit.

8. The protection circuit according to claim 4, wherein the first reference voltage of said comparator is set at a voltage which is higher than an On-state collector voltage and lower than a line power voltage of said drive circuit.

9. The protection circuit according to claim 1, wherein said first comparator, second comparator, logic means, and gate voltage reduction means are formed in semiconductor integrated circuits together with said drive circuit.

10. The protection circuit according to claim 2, wherein said first comparator, second comparator, logic means, and gate voltage reduction means are formed in semiconductor integrated circuits together with said drive circuit.

11. An inverter for converting DC current to AC current, the inverter comprising:
    a power semiconductor device for converting DC current to AC current; and
    a control unit which controls a switching operation of said power semiconductor device, said control unit comprising:
    a first comparator which detects a collector voltage of said power semiconductor device to output a first detection signal when the detected collector voltage exceeds a first reference voltage;
    a second comparator which detects a gate voltage of said power semiconductor device to output a second detection signal, when the detected gate signal exceeds a second reference voltage which is set, relative to the potential at the emitter of said power semiconductor device, to be lower than a line power voltage of a drive circuit for outputting a drive signal that drives said power semiconductor device and higher than a terraced voltage of the power semiconductor device;
    logic means for outputting a protection start signal when both the first and second detection signals are being output;
    gate voltage reduction means for reducing said gate voltage in accordance with the protection start signal from said logic means; and
    computer processor means for controlling the ON/OFF operation of said power semiconductor device, said power semiconductor device being a trench type power semiconductor device.

12. A hybrid electric vehicle having an internal combustion engine, an electric motor, a transmission for transmitting power from said internal combustion engine and/or said electric motor to wheels, an inverter unit for converting DC power to AC power, and a DC power storage unit, wherein said electric motor is an AC motor driven by AC power from said inverter unit including the inverter according to claim 11.

13. An electric vehicle having an electric motor, a transmission for transmitting power from said electric motor to wheels, an inverter unit for converting DC power to AC power, and a DC power storage unit, wherein said electric motor is an AC motor driven by AC power from said inverter unit including the inverter according to claim 11.

* * * * *